United States Patent
Prasad et al.

(10) Patent No.: US 11,217,289 B1
(45) Date of Patent: *Jan. 4, 2022

(54) SPINEL CONTAINING MAGNETIC TUNNEL JUNCTION AND METHOD OF MAKING THE SAME

(71) Applicant: WESTERN DIGITAL TECHNOLOGIES, INC., San Jose, CA (US)

(72) Inventors: Bhagwati Prasad, San Jose, CA (US); Derek Stewart, Livermore, CA (US); Bruce Terris, Sunnyvale, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/944,826

(22) Filed: Jul. 31, 2020

(51) Int. Cl.
| | |
|---|---|
| *G11C 11/16* | (2006.01) |
| *H01L 43/08* | (2006.01) |
| *G01R 33/09* | (2006.01) |
| *H01L 43/04* | (2006.01) |
| *H01L 43/14* | (2006.01) |

(Continued)

(52) U.S. Cl.
CPC .......... *G11C 11/161* (2013.01); *G01R 33/093* (2013.01); *G01R 33/098* (2013.01); *G11C 11/1657* (2013.01); *G11C 11/1659* (2013.01); *H01L 27/228* (2013.01); *H01L 43/04* (2013.01);

(Continued)

(58) Field of Classification Search
None
See application file for complete search history.

(56) References Cited

U.S. PATENT DOCUMENTS

| | | |
|---|---|---|
| 10,229,723 B1 | 3/2019 | Choi et al. |
| 10,354,710 B2 | 7/2019 | Petti et al. |

(Continued)

OTHER PUBLICATIONS

Belmoubarik, M. et al., "MgAl2O4(001) based magnetic tunnel junctions made by direct sputtering of a sintered spinel target," Appl. Phys. Lett. 108, 132404 (2016); https://doi.org/10.1063/1.4945049.

(Continued)

*Primary Examiner* — James G Norman
(74) *Attorney, Agent, or Firm* — The Marbury Law Group PLLC (57) ABSTRACT

A magnetoresistive memory device includes first electrode, a second electrode that is spaced from the first electrode, and a perpendicular magnetic tunnel junction layer stack located between the first electrode and the second electrode. The perpendicular magnetic tunnel junction layer stack includes a first texture-breaking nonmagnetic layer including a first nonmagnetic transition metal, a second texture-breaking nonmagnetic layer including a second nonmagnetic transition metal, a magnesium oxide dielectric layer located between the first and second texture-breaking nonmagnetic layers, a reference layer located between the first and second texture-breaking nonmagnetic layers, a free layer located between the first and second texture-breaking nonmagnetic layers, and a spinel layer located between the reference layer and the free layer, and including a polycrystalline spinel material having (001) texture along an axial direction extending between the reference layer and the free layer.

20 Claims, 5 Drawing Sheets

(51) Int. Cl.
    *H01L 27/22* (2006.01)
    *H01L 43/10* (2006.01)
(52) U.S. Cl.
    CPC .............. *H01L 43/08* (2013.01); *H01L 43/10* (2013.01); *H01L 43/14* (2013.01)

(56) References Cited

U.S. PATENT DOCUMENTS

| | | |
|---|---|---|
| 10,381,551 B1 | 8/2019 | Lille |
| 2016/0314825 A1 | 10/2016 | Sukegawa et al. |
| 2019/0027201 A1 | 1/2019 | Petti et al. |
| 2019/0051822 A1 | 2/2019 | Chatterjee et al. |
| 2019/0080738 A1 | 3/2019 | Choi et al. |
| 2019/0252601 A1 | 8/2019 | Chatterjee et al. |
| 2020/0006633 A1 | 1/2020 | Lille |
| 2020/0091408 A1 | 3/2020 | Sundar et al. |
| 2020/0105999 A1 | 4/2020 | Jeong et al. |
| 2020/0388425 A1* | 12/2020 | Jung .................... G11C 11/161 |

OTHER PUBLICATIONS

Koo, J. et al., "Interface perpendicular magnetic anisotropy in Fe/MgAl2O4 layered structures," Phys. Status Solidi RRL 8, No. 10, 841-844 (2014) / DOI 10.1002/pssr.201409340.
Scheike, T. et al., "Chemical ordering and large tunnel magnetoresistance in Co2FeAl/MgAl2O4/Co2FeAl(001) junctions," Applied Physics Express 9, 053004 (2016), http://doi.org/10.7567/APEX.9.053004.
Sukegawa, H. et al., "Perpendicular magnetic anisotropy at lattice-matched Co2FeAl/MgAl2O4(001) epitaxial interfaces," Appl. Phys. Lett. 110, 112403 (2017); https://doi.org/10.1063/1.4976663.
Tao, B. et al., "Transport Properties in Sputtered CoFeB/MgAl2O4/CoFeB Magnetic Tunnel Junctions," IEEE Transactions On Magnetics, vol. 50, No. 11, Nov. 2014.
Zhang, J. et al., "Spinel oxides: spin-filter barrier for a class of magnetic tunnel junctions," Appl. Phys. Lett. 100, 222401 (2012); doi: 10.1063/1.4722804, View online: https://doi.org/10.1063/1.4722804.
U.S. Appl. No. 16/212,132, filed Dec. 6, 2018, SanDisk Technologies LLC.
U.S. Appl. No. 16/212,257, filed Dec. 6, 2018, SanDisk Technologies LLC.
U.S. Appl. No. 16/212,342, filed Dec. 6, 2018, SanDisk Technologies LLC.
U.S. Appl. No. 16/212,420, filed Dec. 6, 2018, SanDisk Technologies LLC.
U.S. Appl. No. 16/250,403, filed Jan. 17, 2019, SanDisk Technologies LLC.
U.S. Appl. No. 16/401,172, filed May 2, 2019, Western Digital Technologies, Inc.
U.S. Appl. No. 16/442,858, filed Jun. 17, 2019, Western Digital Technologies, Inc.
U.S. Appl. No. 16/558,552, filed Sep. 3, 2019, Western Digital Technologies, Inc.
U.S. Appl. No. 16/661,210, filed Oct. 23, 2019, Western Digital Technologies, Inc.
U.S. Appl. No. 16/666,967, filed Oct. 29, 2019, SanDisk Technologies LLC.
U.S. Appl. No. 16/686,860, filed Nov. 18, 2019, SanDisk Technologies LLC.
U.S. Appl. No. 16/686,917, filed Nov. 18, 2019, SanDisk Technologies LLC.
U.S. Appl. No. 16/692,027, filed Nov. 22, 2019, SanDisk Technologies LLC.
U.S. Appl. No. 16/692,903, filed Nov. 22, 2019, Western Digital Technologies, Inc.
U.S. Appl. No. 16/692,965, filed Nov. 22, 2019, Western Digital Technologies, Inc.
U.S. Appl. No. 16/693,006, filed Nov. 22, 2019, Western Digital Technologies, Inc.
U.S. Appl. No. 16/781,225, filed Feb. 4, 2020, Western Digital Technologies, Inc.
U.S. Appl. No. 16/824,814, filed Mar. 20, 2020, Western Digital Technologies, Inc.
U.S. Appl. No. 16/853,407, filed Apr. 20, 2020, Western Digital Technologies, Inc.
U.S. Appl. No. 16/853,440, filed Apr. 202, 2020, Western Digital Technologies, Inc.
U.S. Appl. No. 16/880,393, filed May 21, 2020, SanDisk Technologies LLC.
U.S. Appl. No. 16/880,497, filed May 21, 2020, SanDisk Technologies LLC.
U.S. Appl. No. 16/910,799, filed Jun. 24, 2020, SanDisk Technologies LLC.
USPTO Office Communication, Notice of Allowance and Fees Due for U.S. Appl. No. 16/944,758, dated Jul. 21, 2021, 12 pages.
Notification of Transmittal of the International Search Report and the Written Opinion of the International Searching Authority for International Patent Application No. PCT/US2021/035880, dated Nov. 17, 2021, 11 pages.

* cited by examiner

SPINEL CONTAINING MAGNETIC TUNNEL JUNCTION AND METHOD OF MAKING THE SAME

FIELD

The present disclosure relates generally to the field of magnetoresistive memory devices and specifically to a magnetoresistive memory device containing a magnetic tunnel junction with a spinel dielectric tunnel barrier layer and methods of making the same.

BACKGROUND

A magnetoresistive memory device can store information employing the difference in electrical resistance of a first configuration in which a ferromagnetic free layer has a magnetization direction that is parallel to the magnetization of a ferromagnetic reference layer and a second configuration in which the free layer has a magnetization direction that is antiparallel to the magnetization of the reference layer. Programming of the magnetoresistive memory device requires flipping of the direction of the magnetization of the free layer employing various external power sources, which may be magnetic in nature or may employ a spin transfer mechanism.

Scalability of spin torque transfer magnetoresistive random access memory (STT-MRAM) devices require a higher than desired current for operation. Scalability of the STT-MRAM devices based on interfacial perpendicular magnetic anisotropy dictates a need to significantly enhance perpendicular magnetic anisotropy (PMA) to achieve required thermal stability for reliable information retention in MRAM devices. At the same time efficient magnetization manipulation is desired for low power consumption during writing information. The need to simultaneously have high energy barriers for retention and low energy barriers for efficient switching is a key challenge for systems with high PMA.

SUMMARY

According to an aspect of the present disclosure, a magnetoresistive memory device includes first electrode, a second electrode that is spaced from the first electrode, and a perpendicular magnetic tunnel junction layer stack located between the first electrode and the second electrode. The perpendicular magnetic tunnel junction layer stack comprises a first texture-breaking nonmagnetic layer comprising a first nonmagnetic transition metal, a second texture-breaking nonmagnetic layer comprising a second nonmagnetic transition metal, a magnesium oxide capping dielectric layer located between the first and second texture-breaking nonmagnetic layers, a reference layer located between the first and second texture-breaking nonmagnetic layers, a free layer located between the first and second texture-breaking nonmagnetic layers, and a spinel layer located between the reference layer and the free layer, and including a polycrystalline spinel material having (001) texture along an axial direction extending between the reference layer and the free layer.

According to another aspect of the present disclosure a method of forming a magnetoresistive memory device comprises forming a first electrode over a substrate, depositing a magnetic tunnel junction layer stack over the first electrode, wherein the magnetic tunnel junction layer stack comprises a first texture-breaking nonmagnetic layer including a first nonmagnetic transition metal, a reference layer including a first amorphous ferromagnetic material, a spinel layer including an amorphous spinel material, a free layer including a second amorphous ferromagnetic material, a magnesium oxide capping dielectric layer including grains having (001) texture, and a second texture-breaking nonmagnetic layer including a second nonmagnetic transition metal, performing an anneal process to induce solid phase epitaxy crystallization of materials of the free layer, the spinel layer, and the reference layer using magnesium oxide capping dielectric layer as a crystallization template layer, to convert the amorphous spinel material into polycrystalline spinel material having (001) texture along an axial direction that is perpendicular to an interface between the spinel layer and the free layer, and forming a second electrode over a portion of the magnetic tunnel junction layer stack prior to or after the anneal process.

According to another embodiment of the present disclosure, a spin orbit torque (SOT) magnetoresistive memory device comprises an electrode, a nonmagnetic heavy metal SOT layer that is spaced from the electrode, and a perpendicular magnetic tunnel junction layer stack located between the electrode and the SOT layer. The perpendicular magnetic tunnel junction layer stack comprises a first texture-breaking nonmagnetic layer comprising a first nonmagnetic transition metal, a second texture-breaking nonmagnetic layer comprising a second nonmagnetic transition metal, a magnesium oxide dielectric layer located between the first and second texture-breaking nonmagnetic layers, a reference layer located between the first and second texture-breaking nonmagnetic layers, a free layer located between the first and second texture-breaking nonmagnetic layers, and a spinel layer located between the reference layer and the free layer, and including a polycrystalline spinel material having (001) texture along an axial direction extending between the reference layer and the free layer.

According to another embodiment of the present disclosure, a method of forming a spin orbit torque (SOT) magnetoresistive memory device comprises forming a nonmagnetic heavy metal SOT layer over a substrate, depositing a magnetic tunnel junction layer stack over the SOT layer, wherein the magnetic tunnel junction layer stack comprises a first texture-breaking nonmagnetic layer including a first nonmagnetic transition metal, a reference layer including a first amorphous ferromagnetic material, a spinel layer including an amorphous spinel material, a free layer including a second amorphous ferromagnetic material, a magnesium oxide dielectric layer including grains having (001) texture, and a second texture-breaking nonmagnetic layer including a second nonmagnetic transition metal, performing an anneal process to induce solid phase epitaxy crystallization of materials of the free layer, the spinel layer, and the reference layer using magnesium oxide dielectric layer as a crystallization template layer, to convert the amorphous spinel material into polycrystalline spinel material having (001) texture along an axial direction that is perpendicular to an interface between the spinel layer and the free layer, and forming an electrode over a portion of the magnetic tunnel junction layer stack prior to or after the anneal process.

DETAILED DESCRIPTION

As discussed above, the embodiments of the present disclosure are directed to a magnetoresistive memory device containing a spinel dielectric tunnel barrier layer in a magnetic tunnel junctions and methods of making the same.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a "spinel" refers to a dielectric compound having a formula of $M_xQ_yO_z$, in which $0.95<x<1.05$, $1.95<y<2.05$ and $3.95<z<4.05$ and M and Q are different metals. In one embodiment, $x=1$, $y=2$ and $z=4$. Exemplary spinels include $MgAl_2O_4$, $ZnAl_2O_4$, $SiMg_2O_4$, $SiZn_2O_4$, $MgGa_2O_4$, doped derivatives therefrom in which a fraction of at least one metallic element is replaced with another metallic element while preserving the crystalline structure, and oxygen-deficient derivatives thereof.

Large tunneling magnetoresistance (TMR) ratios (as defined by the ratio of the difference between the higher tunneling resistance and the low tunneling resistance to the lower tunneling resistance) in a crystalline magnesium oxide (MgO) dielectric tunnel barrier containing magnetic tunnel junction (MTJ) originate from coherent tunneling. The TMR of the MgO-based magnetic tunnel junctions is high at lower operating voltages, and may be greater than 200%. However, maintaining such high TMR ratios (>200%) at higher voltages for better signal-to-noise ratio is challenging. In other words, the TMR ratio of MgO-based magnetic tunnel junctions decreases significantly when the operating voltage of the MgO-based magnetic tunnel junctions increases. The steep decrease in the TMR of the MgO-based magnetic tunnel junctions with an increase of the voltage bias across the magnetic tunnel junctions is believed to be primarily due to crystalline defects at the interface between MgO barrier and the ferromagnetic free and references layers of the magnetic tunnel junction.

The inventors of the present disclosure recognized that the relatively large lattice mismatch on the order of about 3% to 5% at the interface between crystalline magnesium oxide and typical ferromagnetic materials (e.g., CoFeB or CoFe) leads to lattice misfit dislocations, and causes reduction in the TMR at higher voltage bias conditions. The inventors also recognized that spinels, such as $MgAl_2O_4$, have smaller lattice mismatch (in a range from 0.2% to 0.5%) with typical body-centered-cubic ferromagnetic materials, such as CoFeB or CoFe. Thus, the use of spinel in a magnetic tunnel junction can provide desirable tunnel barrier properties. In an illustrative example, a lattice-matched epitaxial heterostructure including a magnetic tunnel junction employing spinel as a tunneling dielectric layer can be constructed on a (001) magnesium oxide substrate, and may provide tunneling magnetoresistance of about 300% or more.

The tunneling magnetoresistance of the lattice-matched epitaxial heterostructure including a magnetic tunnel junction employing spinel as a tunneling dielectric layer provides superior performance at higher operating voltages. For example, the tunneling magnetoresistance ratio of the lattice-matched epitaxial heterostructure at an operating voltage in a range from 1 V to 1.3 V is about one half of the tunneling magnetoresistance ratio of the lattice-matched epitaxial heterostructure at near-zero bias conditions, and may be about 150% to about 300%. In contrast, the tunneling magnetoresistance ratio of a conventional MgO-based magnetic tunnel junction at an operating voltage in a range from 1 V to 1.3 V is only about 125% or less. However, the spinel material provides high tunneling magnetoresistance when it is in a crystalline (e.g., having a spinel lattice structure) state with a (001) preferred crystalline orientation (also referred to as "(001) textured spinel" herein), while amorphous spinel does not provide such enhanced tunneling magnetoresistive effect of (001) textured spinel. While as deposited MgO is often inherently polycrystalline with a (001) preferred crystalline orientation, spinel is typically deposited in the amorphous state unless it is grown over an expensive crystalline (001) MgO substrate. Therefore, it is difficult to form polycrystalline (001) textured spinel over less expensive, commercially available silicon or silicon oxide (e.g., glass) substrates.

Embodiments of the present disclosure provide a method to grow a highly (001) textured spinel material on amorphous ferromagnetic materials (such as amorphous CoFeB) using a (001) textured MgO layer as a crystallization template. This method may be used to form a MTJ over a substrate other than crystalline MgO substrate (i.e., other than a (001) crystalline MgO wafer), such as over a silicon or silicon oxide substrate. The MTJ exhibits a large tunneling magnetoresistance at high voltage bias conditions in magnetic memory applications such as magnetic tunnel junction-based magnetoresistive random access memory devices. Without wishing to be bound by a particular theory, it is believed that the large TMR at applied electric fields is due to the improved interface and reduction of interface defects between the spinel dielectric tunnel barrier layer and the free and/or reference ferromagnetic layers which contact the spinel dielectric tunnel barrier layer. According to an aspect of the present disclosure, the method of forming polycrystalline spinel layer with (001) texture between two ferromagnetic material layers provides a less expensive, lattice-matched epitaxial heterostructure including a magnetic tunnel junction containing a spinel tunneling dielectric layer.

As used herein, the (001) texture in a material layer refers to a growth condition or a crystalline structure in which grains having growth directions or having axial directions that are perpendicular to the (001) plane occupy more than 50% of the entire volume of the material layer. In other words, (001) texture in a material layer refers to a growth condition or a crystalline structure in which grains having a<001>direction as a growth direction or as an axial direction occupy more than 50%, such as 80% to 99%, of the entire volume of the material layer. As used herein, an axial direction refers to the direction that is perpendicular to the planes of the interfaces between neighboring layers. The volume fraction of grains having (001) planes along the growth plane (i.e., having a<001>direction as the axial direction) within (001) textured material can be in a range from 0.5 to 1, such as from 0.8 to 0.99.

Large tunneling magnetoresistance (on the order of 300% or so) observed in prior magnetic tunnel junction devices employing $MgAl_2O_4$ as a tunneling dielectric was realized within magnetic tunnel junctions having in-plane magnetic anisotropy, i.e., in devices in which the magnetization directions are parallel to the interfaces between the $MgAl_2O_4$ and the ferromagnetic material layers. According to an aspect of the present disclosure, a method is provided for fabricating a perpendicular magnetic tunnel junction device including a spinel tunneling dielectric layer and including ferromagnetic material layers having perpendicular magnetic anisotropy, i.e., a magnetic tunnel junction device in which the ferromagnetic material layers have magnetic moments aligned along the axial direction that is perpendicular to the interfaces between the spinel layer and the two ferromagnetic material layers. Further, the direction of the magnetic free layer may be controlled the magnitude of the applied voltage and/or current bias.

Furthermore, without wishing to be bound by a particular theory, the improved lattice matching between the spinel dielectric tunnel barrier layer and the thin ferromagnetic layers may induce stronger interfacial PMA in such thin ferromagnetic layers, which is favorable for forming a perpendicular MTJ with higher thermal stability. Furthermore, using a spinel layer may improve the endurance of the MRAM. The various aspects of embodiments of the present disclosure are now described with reference to the drawings.

Figure 1:
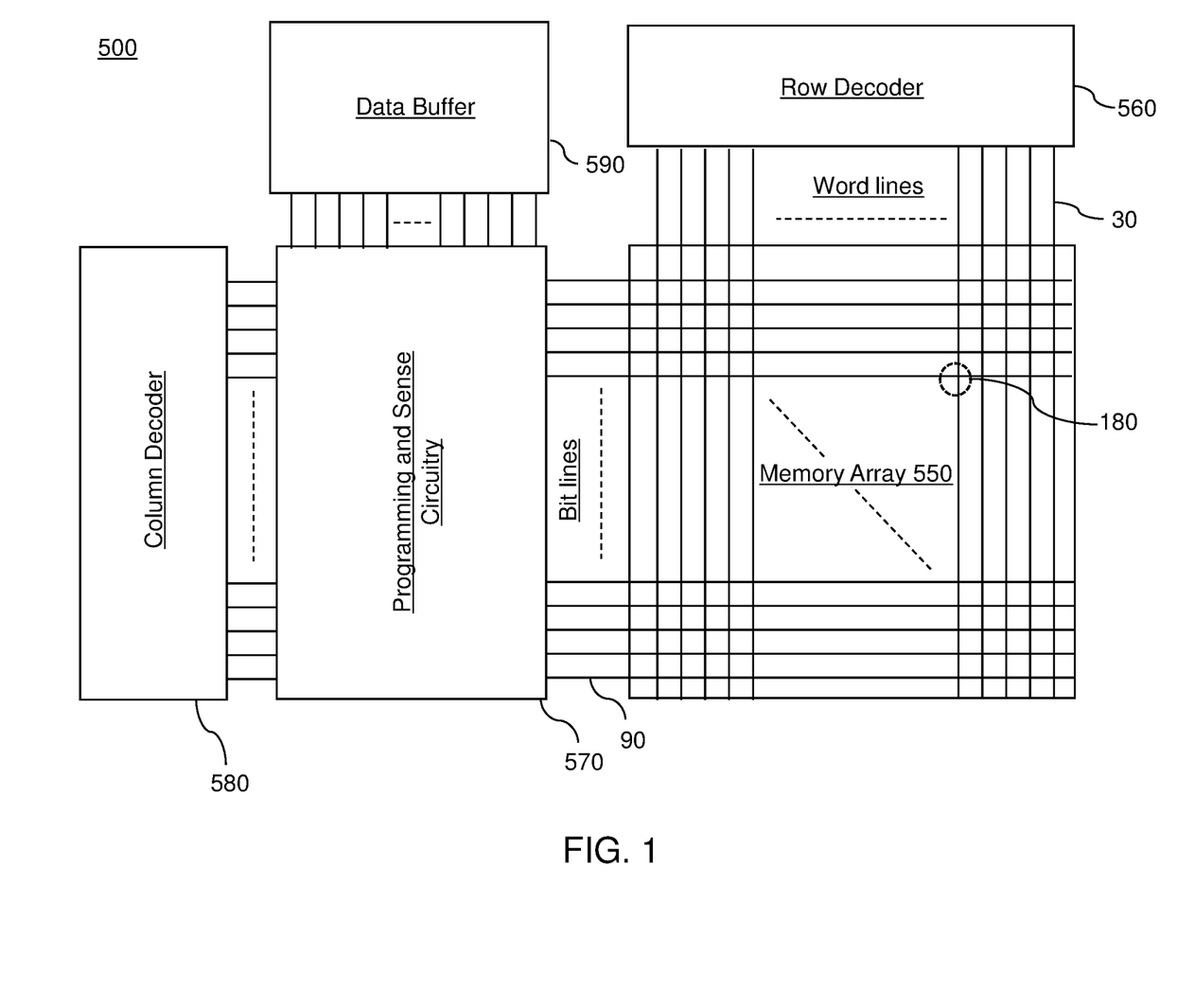
FIG. 1 is a schematic diagram of a random access memory device including magnetoresistive memory cells of the embodiments of the present disclosure in an array configuration.

Referring to FIG. 1, a schematic diagram is shown for a magnetoresistive memory device 500 including multiple magnetoresistive memory cells 180 of embodiments of the present disclosure. In one embodiment, the magnetoresistive memory device 500 can be configured as a magnetoresistive random access memory (MRAM) device containing a two-dimensional array or a three-dimensional array of magnetoresistive memory cell 180 of the embodiments of the present disclosure. As used herein, a "random access memory device" refers to a memory device containing memory cells that allow random access, e.g., access to any selected memory cell upon a command for reading the contents of the selected memory cell.

The magnetoresistive memory device 500 can include a memory array region 550 containing an array of the respective magnetoresistive memory cells 180 located at the intersection of the respective word lines 30 and bit lines 90. The magnetoresistive memory device 500 may also contain a row decoder 560 connected to the word lines 30, a combination of a programming and sense circuitry 570 (which can include programming transistors, sense amplifiers, and other bit line control circuitry) connected to the bit lines 90, a column decoder 580 connected to the bit lines 90 through the programming and sense circuitry 570, and a data buffer 590 connected to the programming and sense circuitry 570. Multiple instances of the magnetoresistive memory cells 180 are provided in an array configuration that forms the magnetoresistive memory device 500. As such, each of the magnetoresistive memory cells 180 can be a two-terminal device including a respective first electrode and a respective second electrode. It should be noted that the location and interconnection of elements are schematic and the elements may be arranged in a different configuration. Further, a magnetoresistive memory cell 180 may be manufactured as a discrete device, i.e., a single isolated device.

Figure 2:
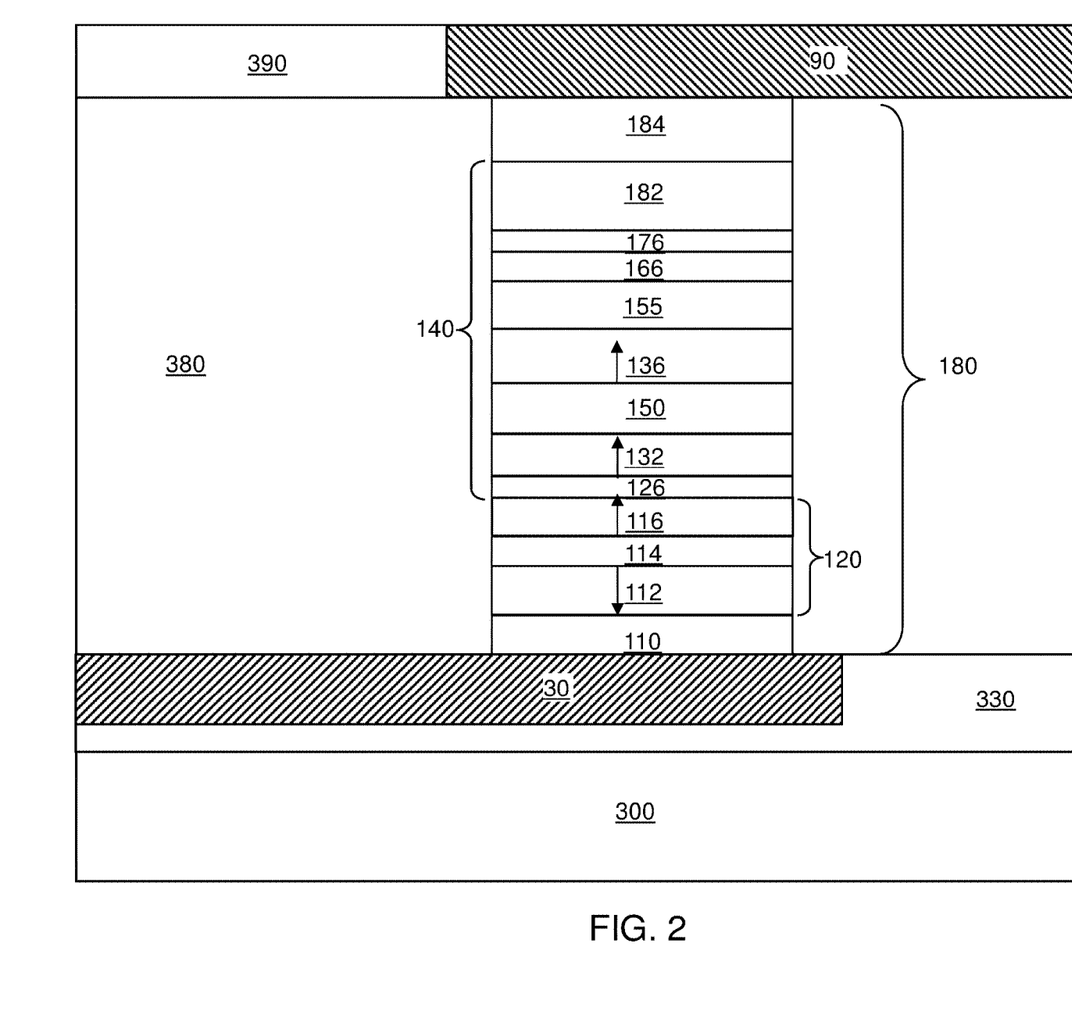
FIG. 2 is a schematic vertical cross-sectional view of a first exemplary magnetoresistive memory cell according to a first embodiment of the present disclosure.

Referring to FIG. 2, a first exemplary magnetoresistive memory cell 180 of an embodiment of the present disclosure is illustrated. The illustrated magnetoresistive memory cell 180 may be STT-MRAM type magnetoresistive memory cell 180 within the array of magnetoresistive memory cells 180 illustrated in FIG. 1. Each of the magnetoresistive memory cells 180 can be formed over a substrate 300, which may be a combination of a substrate which is not lattice matched to a spinel dielectric tunnel barrier layer (e.g., silicon or silicon oxide substrate, not expressly shown), steering and driver circuit elements (such as field effect transistors, diodes, Ovonic threshold switches, or other semiconductor devices) for operating the array of magnetoresistive memory cells 180 to be formed thereupon, and dielectric material layers (not expressly shown) embedding metal interconnect structures (not expressly shown) and overlying the steering devices. The metal interconnect structures can provide electrical connection between the driver circuit elements and can be configured to provide electrical connection to the array of magnetoresistive memory cells 180 through word lines 30 and bit lines 90, or through discrete sets of metal interconnect structures in case the magnetoresistive memory cells 180 are configured to be accessed by discrete sets of metal interconnect structures that are not shared with other magnetoresistive memory cells 180.

In case word lines 30 and bit lines 90 are employed, a lower-level dielectric layer 330 may embed a lower set of access lines, which may be the word lines 30 or the bit lines 90 depending on the configuration. A material layer stack can be deposited over the top surface of the lower-level dielectric layer 330, and can be patterned to form a two-dimensional array of magnetoresistive memory cells 180. A memory-level dielectric layer 380 can be formed around the two-dimensional array of magnetoresistive memory cells 180, and can be planarized to provide a horizontal top surface that is planar with the top surfaces of the magnetoresistive memory cells 180. An upper-level dielectric layer 390 embedding an upper set of access lines can be formed. In one embodiment, the lower set of access lines can be word lines 30 and the upper set of access lines can be bit lines 90. Alternatively, the lower set of access lines can be bit lines 90 and the upper set of access lines can be word lines 30. Generally, a word line 30 can contact one of the first electrode 110 and the second electrode 184, and a bit line 90 can contact the other of the first electrode 110 and the second electrode 184. In an alternative configuration in which each magnetoresistive memory cell 180 is individually addressed by a dedicated steering (i.e., selector) element (e.g., access transistor, diode or Ovonic threshold switch device, of which the number can be the same as the number magnetoresistive memory cells 180), a pair of dedicated electrically conductive paths that are not shared with other magnetoresistive memory cell 180 can contact the first electrode 110 and the second electrode 184. While not illustrated in the drawings, the steering (i.e., selector) element may be inserted between a magnetoresistive memory cell 180 and one of the access lines (which may be a word line 30 or a bit line 90). Generally, the illustrated magnetoresistive memory cell 180 of FIG. 2 can be incorporated into any circuit setting that enable detection of tunneling magnetoresistance.

In one embodiment, the lower-level dielectric layer 330 and the upper-level dielectric layer 390 include a respective dielectric material such as undoped silicate glass, a doped silicate glass, organosilicate glass, or silicon nitride. The thickness of each of the lower-level dielectric layer 330 and the upper-level dielectric layer 390 may be in a range from 50 nm to 600 nm, such as from 100 nm to 300 nm, although lesser and greater thicknesses can also be employed. Each of the word lines 30 and the bit lines 90 may include a highly electrically conductive metal, such as tantalum, tungsten, titanium, copper, molybdenum, ruthenium, a stack thereof, or an alloy thereof. In one embodiment, each of the word lines 30 and the bit lines 90 may include a combination of a conductive metallic barrier liner including TiN, TaN, and/or WN and a conductive fill material located inside the metallic barrier liner. The conductive fill material may include copper, tungsten, molybdenum, tantalum, titanium, ruthenium, etc. The thickness of the word lines 30 and the bit lines 90 can be in a range from 50 nm to 600 nm, such as from 100 nm to 300 nm, although lesser and greater thicknesses can also be employed.

The material layer stack that is deposited over the top surface of the lower-level dielectric layer 330 to provide a two-dimensional array of magnetoresistive memory cells 180 can include, from bottom to top, a first electrode 110 layer (that is subsequently patterned to form the first electrode 110), an optional synthetic antiferromagnetic (SAF) structure 120 layer stack, a magnetic tunnel junction 140 layer stack, and a second electrode layer (that is subsequently patterned to form a second electrode 184). The SAF structure 120 layer stack (if present) includes antiferromagnetically coupled layers, which may containing at least one ferromagnetic material layer 112, at least one non-magnetic spacer layer 114 and at least one second ferromagnetic layer 116.

The magnetic tunnel junction 140 layer stack can be located over the SAF structure 120 layer stack, and include, from bottom to top or from top to bottom, a first texture-breaking nonmagnetic layer 126, a reference layer 132, a spinel layer 150, a free layer 136, a magnesium oxide capping dielectric layer 155, an optional cap ferromagnetic layer 166, a second texture-breaking nonmagnetic layer 176, and a capping metal layer 182. While embodiments of the present disclosure are described employing an embodiment in which the magnetic tunnel junction 140 layer stack includes, from bottom to top, a first texture-breaking nonmagnetic layer 126, a reference layer 132, a spinel layer 150, a free layer 136, a magnesium oxide capping dielectric layer 155, an optional cap ferromagnetic layer 166, a second texture-breaking nonmagnetic layer 176, and a capping metal layer 182, an alternative embodiment is expressly contemplated herein in which the order of layers in the magnetic tunnel junction 140 layer stack is reversed during the deposition process. In this alternative embodiment, the SAF structure 120 layer stack is formed over the magnetic tunnel junction 140 layer stack.

The first electrode layer includes a first nonmagnetic metallic electrode material that can function as a crystallization seed material for material layers to be subsequently deposited thereupon. The first electrode layer includes a nonmagnetic transition metal, and may include one or more of Ta, Ti, V, Cr, Mn, Zr, Nb, Mo, Tc, Ru, Rh, Hf, W, Re, Os, and Ir. In one embodiment, the first electrode layer can include tantalum. The first electrode layer may function as a seed layer. The first electrode layer can be deposited, for example, by sputtering. The first electrode layer can have a thickness in a range from 2 nm to 10 nm. The first electrode layer may be deposited as a polycrystalline layer having a predominant (111) texture or as an amorphous layer. As used herein, a crystallographic plane texture in a material layer refers to a growth condition or a crystalline structure in which grains having crystallographic orientations that are perpendicular to the crystallographic plane are predominant, i.e., occupy more than 50% %, such as 80% to 99% of the entire volume of the material layer. For example, (111) texture in a material layer refers to a growth condition or a crystalline structure in which grains having growth directions or having axial directions that are perpendicular to the (111) plane occupy more than 50% of the entire volume of the material layer. In other words, (111) texture in a material layer refers to a growth condition or a crystalline structure in which grains having a <111>direction as a growth direction or as an axial direction occupy more than 50%, such as 80% to 99%, of the entire volume of the material layer. As used herein, an axial direction refers to the direction that is perpendicular to the planes of the interfaces between neighboring layers. In one embodiment, the first electrode layer includes a polycrystalline tantalum layer having (111) texture. The volume fraction of grains having (111) planes along the growth plane (i.e., having a <111>direction as the axial direction) within the first electrode layer can be in a range from 0.5 to 1, such as from 0.8 to 0.99. Optionally, an anneal process may be performed to induce crystallization of the first electrode layer. In one embodiment, the first electrode layer may include, and or may consist essentially of, tantalum.

The at least one ferromagnetic material layer 112 includes, cobalt, an alloy of cobalt and iron (CoFe), or an alloy of cobalt, iron, and boron ("CoFeB"). In one embodiment, the SAF spacer layer 114 comprises iridium, ruthenium, or chromium. In one embodiment, the SAF structure 120 may include a Co/Pt superlattice.

Each of the first texture-breaking nonmagnetic layer 126, a reference layer 132, a spinel layer 150, a free layer 136, an optional cap ferromagnetic layer 166, and a second texture-breaking nonmagnetic layer 176 can be deposited at room temperature (298 K) or within 100 degrees Celsius of room temperature as a respective amorphous material layer by sputtering or other suitable deposition process.

The first texture-breaking nonmagnetic layer 126 can include a first nonmagnetic transition metal, which may be tungsten, ruthenium, tantalum, niobium, molybdenum, rhenium, platinum, palladium, iridium, or an alloy thereof, which provides high spin orbit coupling. The first texture-breaking nonmagnetic layer 126 may include a nonmagnetic transition metal having a melting point of at least 1,500 degrees Celsius so that bulk diffusion within the first texture-breaking nonmagnetic layer 126 is insufficient to cause further crystallization therein or to function as a template for solid phase epitaxy in a subsequent anneal process. The first texture-breaking nonmagnetic layer 126 may be deposited as an amorphous material by physical vapor deposition performed at room temperature. The thickness of the first texture-breaking nonmagnetic layer 126 can have a thickness in a range from 0.2 nm to 1 nm.

The reference layer 132 can be formed by depositing a first amorphous ferromagnetic material. For example, the reference layer 132 can include an amorphous CoFe layer, an amorphous CoFeB layer, or an amorphous stack of Co/Ni multilayers or Co/Fe multilayers. The reference layer 132 may be deposited as an amorphous material by physical vapor deposition performed at room temperature. The thickness of the reference layer 132 can be in a range from 0.8 nm to 1.2 nm, although lesser and greater thicknesses can also be employed.

The spinel layer 150 can be formed by depositing an amorphous spinel material, which may include, and/or may consist essentially of, $MgAl_2O_4$, $ZnAl_2O_4$, $SiMg_2O_4$, $SiZn_2O_4$, $MgGa_2O_4$, doped derivatives therefrom in which a fraction of at least one metallic element is replaced with another metallic element while preserving the crystalline structure, and oxygen-deficient derivatives thereof. Preferably, $Mg_xAl_yO_z$, in which $0.95<x<1.05$, $1.95<y<2.05$ and $3.95<z<4.05$, such as $MgAl_2O_4$ is used. During an immediately after deposition, the spinel layer 150 includes the spinel material in an amorphous form. In one embodiment, the amorphous spinel material of the spinel layer 150 can be deposited directly on the amorphous metallic material of the reference layer 132. The spinel layer 150 can be formed by physical vapor deposition or vacuum evaporation of source materials including component atoms of the spinel material. The thickness of the spinel layer 150 for a STT MRAM memory cell 180 can be in a range from 0.8 nm to 1.2 nm, although lesser and greater thicknesses can also be employed.

The free layer 136 can be formed by depositing a second amorphous ferromagnetic material. For example, the free layer 136 can include an amorphous CoFe layer, a CoFeB layer, or an amorphous stack of Co/Ni multilayers or Co/Fe multilayers. The free layer 136 may be deposited as an amorphous material by physical vapor deposition performed at room temperature. The thickness of the free layer 136 can be in a range from 0.5 nm to 2.0 nm, although lesser and greater thicknesses can also be employed.

The magnesium oxide capping dielectric layer 155 can be deposited by sputtering or by vacuum evaporation. The magnesium oxide capping dielectric layer 155 is formed with (001) texture. In other words, a predominant portion of the magnesium oxide capping dielectric layer is formed with a<001>growth direction with a (001) growth plane. The propensity to provide (001) texture in the deposited magnesium oxide capping dielectric layer is an inherent crystalline property of magnesium oxide. The deposition temperature for the magnesium oxide capping dielectric layer 155 can be room temperature. The thickness of the magnesium oxide capping dielectric layer 155 can be in a range from 0.5 nm to 2 nm, such as 0.5 nm to 0.8 nm although lesser and greater thicknesses can also be employed.

The optional cap ferromagnetic layer 166 can be formed by depositing an additional amorphous ferromagnetic material. For example, the cap ferromagnetic layer 166 can include an amorphous CoFe layer, a CoFeB layer, an amorphous stack of Co/Ni multilayers or Co/Fe multilayers. The cap ferromagnetic layer 166 may be deposited as an amorphous material by physical vapor deposition performed at room temperature. The thickness of the cap ferromagnetic layer 166 can be in a range from 0.2 nm to 0.8 nm, although lesser and greater thicknesses can also be employed.

The second texture-breaking nonmagnetic layer 176 can include a second nonmagnetic transition metal, which may be tungsten, ruthenium, tantalum, niobium, molybdenum, rhenium, platinum, palladium, iridium, or an alloy thereof. The second texture-breaking nonmagnetic layer 176 includes a nonmagnetic transition metal having a melting point of at least 1,500 degrees Celsius so that bulk diffusion within the second texture-breaking nonmagnetic layer 176 is insufficient to cause further crystallization therein or to function as a template for solid phase epitaxy in a subsequent anneal process. The first nonmagnetic transition metal of the first texture-breaking nonmagnetic layer 126 and the second nonmagnetic transition metal of the second texture-breaking nonmagnetic layer 176 may be selected independently. In one embodiment, the first nonmagnetic transition metal and the second nonmagnetic transition metal may be tungsten. The second texture-breaking nonmagnetic layer 176 may be deposited as an amorphous material by physical vapor deposition performed at room temperature. The thickness of the second texture-breaking nonmagnetic layer 176 can have a thickness in a range from 0.2 nm to 1.0 nm.

The optional capping metal layer 182 includes a nonmagnetic transition metal, and may include one or more of Ta, Ti, V, Cr, Mn, Zr, Nb, Mo, Tc, Ru, Rh, Hf, W, Re, Os, and Ir. The capping metal layer 182 may be deposited by sputtering. The thickness of the capping metal layer 182 can be in a range from 2 nm to 10 nm, such as from 5 nm to 8 nm, although lesser and greater thicknesses can also be employed.

The second electrode 184 layer includes a nonmagnetic transition metal, and may include one or more of Ta, Ti, V, Cr, Mn, Zr, Nb, Mo, Tc, Ru, Rh, Hf, W, Re, Os, and Ir. The second electrode layer may be deposited by sputtering. The thickness of the second electrode layer can be in a range from 2 nm to 10 nm, such as from 5 nm to 8 nm, although lesser and greater thicknesses can also be employed. In one embodiment, the capping metal layer 182 can include tantalum, and the second electrode 184 layer can include ruthenium.

A post-deposition anneal process can be performed at an elevated temperature in a range from 250 degrees Celsius to 500 degrees Celsius optionally in the presence of a magnetic field. Generally, the elevated temperature of the anneal process is selected such that solid phase epitaxy of materials of the free layer 136, the spinel layer 150, and the reference layer 132 is induced by the elevated temperature of the anneal process.

During the thermal anneal process, the (001) texture grains in the magnesium oxide capping dielectric layer 155 may further grow and merge while maintaining the (001) texture. The entirety of the magnesium oxide capping dielectric layer 155 contains large (001) textured grains that occupies a predominant volume (such a more than 80%, and/or more than 90%, and/or more than 95%, and/or more than 98%, and/or more than 99%). The (001) textured crystalline structure of the magnesium oxide capping dielectric layer 155 functions as a crystallization template for the amorphous materials of the free layer 136, the spinel layer 150, and the reference layer 132, and for the amorphous material of the optional cap ferromagnetic layer 166 during a solid phase epitaxy process that occurs during the thermal anneal process. In other words, the thermal anneal process comprises a solid phase epitaxy process. After the solid phase epitaxy process, the spinel layer 150 comprises polycrystalline spinel material having the (001) texture along the axial direction, which is a direction that is perpendicular to an interface between the spinel layer 150 and the free layer 136.

Grains in each layer between the first texture-breaking nonmagnetic layer 126 and the second texture-breaking non-magnetic layer 176 are oriented along the (001) direction after the solid phase epitaxy process. The spinel layer 150 is converted into a highly (001) textured spinel layer. The average grain size (i.e., the diameter of a sphere having the same volume as the average volume of the grains) in the spinel layer 150 can be on the order of the thickness of the spinel layer 150 or larger. For example, the average grain size of grains in the spinel layer 150 may be in a range from 1 nm to 4 nm, although lesser and greater grain sizes can also be employed.

Grains of the magnetic materials in the free layer 136, the reference layer 132, and the optional cap ferromagnetic layer 166 grow along the (001) texture during the solid phase epitaxy process. Further, the free layer 136, the reference layer 132, and the optional cap ferromagnetic layer 166 are magnetized along the vertical direction during the thermal anneal process due to the external magnetic field. The spinel layer 150 functions as a dielectric tunnel barrier layer of the magnetic tunnel junction, and the magnesium oxide capping dielectric layer 155 functions as a capping dielectric layer of the magnetic tunnel junction.

Generally, the solid phase epitaxy process that accompanies the anneal process converts each of the reference layer 132, the free layer 136, and the cap ferromagnetic layer 166 into respective polycrystalline ferromagnetic material layers having (001) texture. Grains in the free layer 136 are epitaxially aligned to grains within the magnesium oxide capping dielectric layer 155 during the solid phase epitaxy process. As used herein, two contacting grains of different material layers are epitaxially aligned with each other if there is epitaxial alignment, i.e., atomic registry, between atoms of the material layers across the interface between the two material layers. Grains in the spinel layer 150 are epitaxially aligned to the grains in the free layer 136 during the solid phase epitaxy process. Grains in the reference layer 132 are epitaxially aligned to the grains in the spinel layer 150 in the solid phase epitaxy process. The amorphous ferromagnetic material in the cap ferromagnetic layer 166 is converted into a polycrystalline ferromagnetic material having (001) texture by the solid phase epitaxy process. Grains of the cap ferromagnetic layer 166 can be epitaxially aligned to the grains within the magnesium oxide capping dielectric layer 155 during the solid phase epitaxy process.

The layer stack including the reference layer 132, the spinel layer 150, the free layer 136, and the optional cap ferromagnetic layer 166 forms a lattice-matched epitaxial heterostructure (132, 150, 136, 166), in which different material layers are epitaxially aligned at boundaries of material layers. The epitaxial alignment across the different material layers can be grain by grain, and grain boundaries may propagate through the different material layers within the lattice-matched epitaxial heterostructure (132, 150, 136, 166).

In one embodiment, each of the first texture-breaking nonmagnetic layer 126 and the second texture-breaking nonmagnetic layer 176 can block propagation of crystalline alignment of materials thereacross during the solid phase epitaxy process. In the absence of the first texture-breaking nonmagnetic layer 126, the grain structure within the SAF structure 120 would propagate into the reference layer 132 and the spinel layer 150. According to an aspect of the present disclosure, presence of the first texture-breaking nonmagnetic layer 126 prevents such propagation of crystalline structure through the first texture-breaking nonmagnetic layer 126 from the side of the SAF structure 120, and allows solid phase epitaxy in which the textured crystalline structure in the magnesium oxide capping dielectric layer 155 functions as a template for the entirety of the free layer 136, the spinel layer 150, and the reference layer 136. According to another aspect of the present disclosure, presence of the second texture-breaking nonmagnetic layer 176 prevents such propagation of crystalline structure through the second texture-breaking nonmagnetic layer 176 from the side of the capping metal layer 182, and allows solid phase epitaxy in which the textured crystalline structure in the magnesium oxide capping dielectric layer 155 functions as a template for the entirety of the optional cap ferromagnetic layer 166. The optional cap ferromagnetic layer 166 has the function of providing an amorphous material immediately on the magnesium oxide capping dielectric layer 155, which allows the grains within the magnesium oxide capping dielectric layer 155 to grow to a larger size during the anneal process.

In one embodiment, the first nonmagnetic transition metal of the first texture-breaking nonmagnetic layer 126 can be deposited as an amorphous and remains amorphous during the solid phase epitaxy process, and/or the second nonmagnetic transition metal of the second texture-breaking nonmagnetic layer 176 may be deposited as an amorphous and remains amorphous during the solid phase epitaxy process. Alternatively, the first nonmagnetic transition metal of the first texture-breaking nonmagnetic layer 126 can be deposited with (111) texture and maintain the (111) texture during the solid phase epitaxy process, and/or the second nonmagnetic transition metal of the second texture-breaking nonmagnetic layer 176 may be deposited with (111) texture and maintain the (111) texture during the solid phase epitaxy process. The high melting temperature of the first nonmagnetic transition metal and the second nonmagnetic transition metal provide low bulk diffusion coefficient for the materials of the first texture-breaking nonmagnetic layer 126 and the second texture-breaking nonmagnetic layer 176, and thus, the first texture-breaking nonmagnetic layer 126 and the second texture-breaking nonmagnetic layer 176 do not function as a template for solid phase epitaxy. In other words, lack of bulk diffusion suppresses change in amorphousness or further crystallization in the first texture-breaking nonmagnetic layer 126 and the second texture-breaking nonmagnetic layer 176 during the anneal process. In one embodiment, the first nonmagnetic transition metal and the second nonmagnetic transition metal may be independently selected from tungsten, ruthenium tantalum, niobium, molybdenum, and rhenium, platinum, palladium, iridium, and each of the first texture-breaking nonmagnetic layer 126 and the second texture-breaking nonmagnetic layer 176 may a thickness in a range from 0.2 nm to 1.0 nm.

The material layer stack including the first electrode 110 layer, the layer stack 112, 114, 116, 126, 132, 150, 136, 155, 166, 176, 182, and a second electrode 184 layer can be patterned to form at least one magnetoresistive memory cell 180. For example, a photoresist layer (not shown) can be applied over the second electrode 184 layer, and can be lithographically patterned to form a two-dimensional array of discrete photoresist material portions having a two-dimensional periodicity. An anisotropic etch process can be performed to etch unmasked portions of the first electrode 110 layer, the layer stack 112, 114, 116, 126, 132, 150, 136, 155, 166, 176, 182, and a second electrode 184 layer. Each remaining portion of the first electrode 110 layer, the layer stack 112, 114, 116, 126, 132, 150, 136, 155, 166, 176, 182, and a second electrode layer constitutes a magnetoresistive memory cell 180. A two-dimensional array of magnetoresistive memory cells 180 may be formed. The photoresist layer can be removed, for example, by ashing.

Each magnetoresistive memory cell 180 includes a first electrode 110 which is a patterned portion of the first electrode layer. Each magnetoresistive memory cell 180 includes a second electrode 184 which is a patterned portion of the second electrode layer. Each contiguous combination of layers 112, 114 and 116 within a magnetoresistive memory cell 180 constitutes the synthetic antiferromagnet (SAF) structure 120. Each contiguous combination of a reference layer 132, a spinel layer 150, and a free layer 136 constitutes a ferromagnetic tunnel junction structure 140.

Subsequently, the upper-level dielectric layer 390 embedding the upper set of access lines can be formed. In one embodiment, the lower set of access lines can be word lines 30 and the upper set of access lines can be bit lines 90. Each second electrode 184 can be contacted by one of the upper set of access lines (such as a bit line 90).

The first exemplary magnetoresistive memory cell 180 of FIG. 2 comprises a spin torque transfer (STT) magnetoresistive memory (e.g., STT-MRAM) device. During operation of the STT-MRAM device a tunneling current flows through the spinel dielectric tunnel barrier layer 150 between the reference layer 132 and the free layer 136 to program the magnetization direction of the free layer 136 into either the parallel state (i.e., cell low resistance state) or the antiparallel state (e.g., cell high resistance state) to the magnetization direction of the reference layer 132 by applying a voltage between the word line and the bit line. Layer 150 may be thicker than layer 155 in one embodiment. The magnitude of voltage drop across the spinel dielectric tunnel barrier layer 150 may be greater than the magnitude of voltage drop across the magnesium oxide capping dielectric layer 155. The spinel dielectric tunnel barrier layer 150 provides a TMR of at least 250%, such as 250% to 300% TMR at higher bias, which leads to better signal to noise ratio and better endurance due to fewer interfacial defects than a MgO dielectric tunnel barrier.

Figure 3:
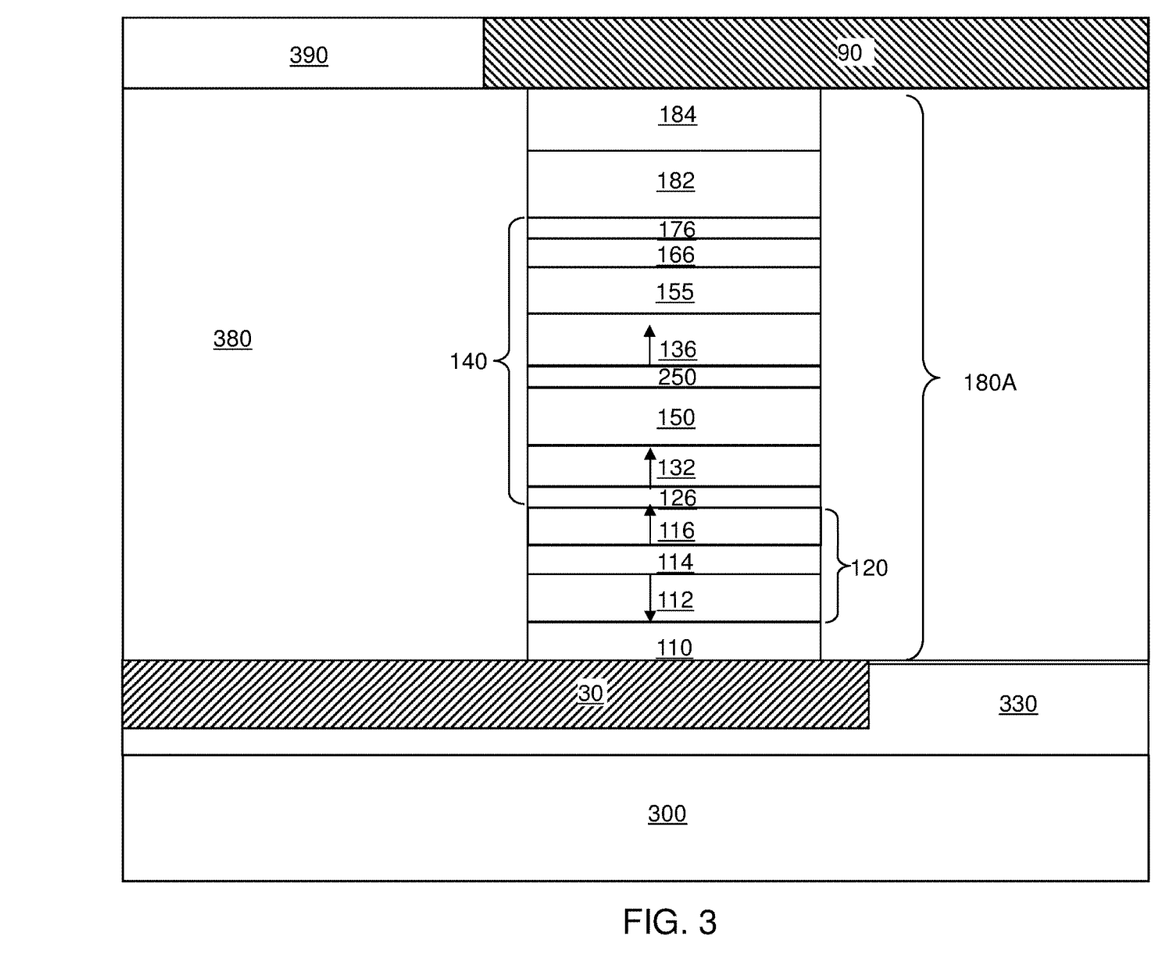
FIG. 3 is a schematic vertical cross-sectional view of a second exemplary magnetoresistive memory cell according to a second embodiment of the present disclosure.

FIG. 3 is a schematic vertical cross-sectional view of a second exemplary magnetoresistive memory cell 180A of a second embodiment, in which the second exemplary magnetoresistive memory cell 180A functions as a voltage controlled magnetic anisotropy (VCMA) cell. The second exemplary magnetoresistive memory cell 180A can be derived from the first exemplary memory cell 180 of FIG. 2 by increasing the thickness of the spinel dielectric tunnel barrier layer 150 above 1.2 nm. For example, the thickness of the spinel dielectric tunnel barrier layer 150 may be 1.5 nm to 3 nm. In this second embodiment, the higher thickness of the spinel dielectric tunnel barrier layer 150 prevents tunneling current flow through the spinel dielectric tunnel barrier layer 150 during programming of the cell 180A. Therefore, the applied voltage is used to switch the magnetization direction of the free layer 136. The applied voltage lowers the energy barrier height of the spinel dielectric tunnel barrier layer 150 in one bias direction and raises it for the other bias direction. The improved quality and lower defect density of the lattice matched interface between the ferromagnetic layers (132, 136) and the crystalline spinel dielectric tunnel barrier layer 150 can induce strong PMA. Without wishing to be bound by a particular theory, it is believed that the strong PMA may lead to a higher switching energy required to switch (i.e., flip) the magnetization direction of the free layer 136, which provides an improved device thermal stability.

Optionally, an ultra-thin, electrically conductive insertion layer 250 may be formed between the spinel dielectric tunnel barrier layer 150 and the free layer 136 to further enhance the VCMA effect in this second embodiment. The insertion layer 250 may comprise a nonmagnetic metal, such as hafnium or palladium or an antiferromagnetic layer, such as iridium. The thickness of the insertion layer 250 may be between 0.02 nm and 0.1 nm. Thus, the insertion layer 250 may be a discontinuous layer (e.g., metal dusting layer).

Figure 4:
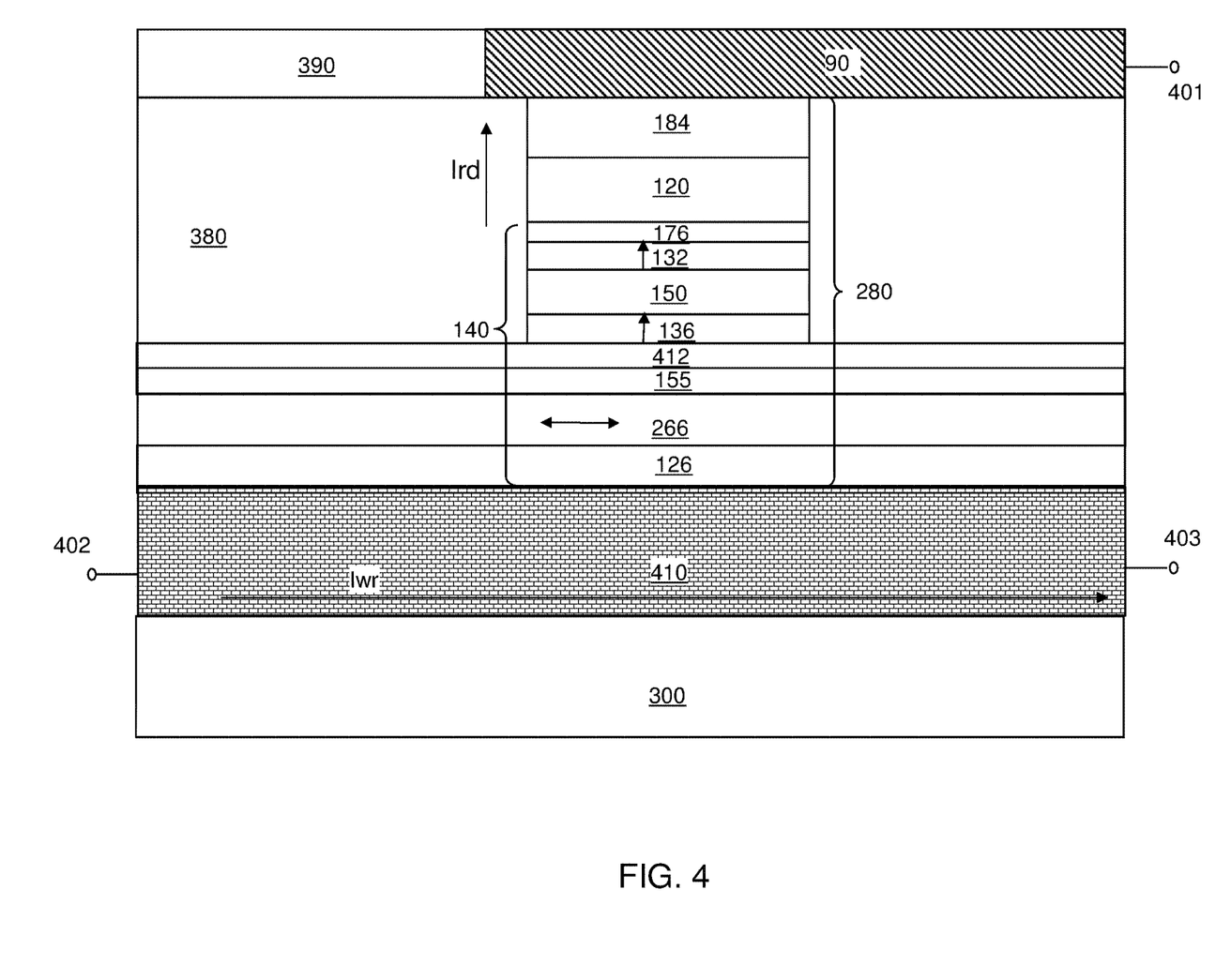
FIGS. 4 and 5 are a schematic vertical cross-sectional views of third and fourth exemplary magnetoresistive memory cells according to a third embodiment of the present disclosure.

FIG. 4 is a schematic vertical cross-sectional view of a third exemplary magnetoresistive memory cell 280 of a third embodiment, in which the third exemplary magnetoresistive memory cell 280 functions as a spin orbit torque (SOT) cell (i.e., SOT MRAM cell). The SOT MRAM cell 280 shown in FIG. 4 is a three terminal device. Therefore, a SOT magnetoresistive memory device containing the SOT MRAM cells 280 is different from the STT or VCMA magnetoresistive memory device 500 shown in FIG. 1 because SOT magnetoresistive memory device includes three access lines rather than two access lines (i.e., word lines 30 and bit lines 90) shown in FIG. 1. Therefore, the SOT MRAM cell 280 shown in FIG. 4 includes a top access line 90 (e.g., bit line) electrically connected to a first electric terminal 401 of the SOT magnetoresistive memory device and a nonmagnetic heavy metal SOT layer 410 with strong spin-orbit coupling with, and in contact with the free layer 136. The SOT layer 410 is electrically connected to second and third electric terminals 402 and 403 of the SOT magnetoresistive memory device.

When an electric write current (Iwr) laterally passes through the SOT layer 410 between the second and third electric terminals 402 and 403, spin current is generated in a direction perpendicular to the electrical current via the spin Hall effect (SHE). The spin current exerts a torque on the magnetization of the free layer 136. Thus, the SOT layer 410 assists in the transition of the magnetization direction in the free layer 136 through the spin Hall effect. Thus, the SOT layer 410 is also referred to as metallic assist layer, i.e., a metallic layer that assists the magnetic transition in the free layer 136.

Since write operation in SOT devices happens via the STO layer 410, very little electrical current flows through the magnetic tunnel junction 140 including the free layer 136. The read current Ird flows vertically through the magnetic tunnel junction 140 between the first terminal 401 and the second terminal 402.

The SOT layer 410 may be made of an electrically conductive material having large spin-orbit coupling strength, such as Pt, Ta, W, Hf, Jr, CuBi, CuIr, AuPt, AuW, PtPd, or PtMgO. The SOT layer 410 may have a thickness from 5 nm to 10 nm although lesser and greater thicknesses can also be employed.

In this embodiment, the first electrode layer 110 shown in FIGS. 2 and 3 may be omitted and the position of the magnetic tunnel junction 140 relative to the SAF structure 120 are reversed, such that the SAF structure 120 is formed over the magnetic tunnel junction 140 and below the second electrode 184.

Specifically, the SOT layer 410 acts as the first electrode of the cell 280. The first texture-breaking nonmagnetic layer 126 may be located on the SOT layer 410. An optional in plane magnetization ferromagnetic layer 266 can be formed on the first texture-breaking nonmagnetic layer 126. The optional in plane magnetization ferromagnetic layer 266 may comprise a CoFe or CoFeB layer having a thickness of at least 2 nm, such as 2 nm to 3 nm. At such thicknesses, the CoFe or CoFeB layer typically has an in plane magnetization direction which is perpendicular to the magnetization directions of the free layer 136. The in-plane CoFeB or CoFe layer 266 serves as a built-in magnetic field source for achieving field free deterministic SOT switching. The magnesium oxide dielectric layer 155 can be formed on the optional in plane magnetization ferromagnetic layer 266. The magnesium oxide dielectric layer 155 can have a thickness of 0.5 nm to 1 nm in this embodiment. The thin magnesium oxide dielectric layer 155 allows sufficient spin polarized electrons created by the SOT layer 410 to pass through it for switching the magnetization direction of the free layer 136. In an alternative embodiment, the magnesium oxide dielectric layer 155 can be formed on first texture-breaking nonmagnetic layer 126, and the in plane magnetization ferromagnetic layer 266 can be formed on the magnesium oxide dielectric layer 155. A nonmagnetic metal layer 412 can be formed on the magnesium oxide dielectric layer 155. The nonmagnetic metal layer 412 can be a platinum or tantalum layer and can have a thickness of 1 nm to 2 nm. Layers 126, 266, 155 and 412 may extend outside the lateral boundaries of the cell 280.

The free layer 136 can be formed on the nonmagnetic metal layer 412. The free layer 136 can have a thickness of 0.2 nm to 0.8 nm in this embodiment. The spinel dielectric tunnel barrier layer 150 can be formed on the free layer 136. The spinel dielectric tunnel barrier layer 150 can have a thickness of 0.5 nm to 2 nm in this embodiment. The reference layer 132 can be formed on the spinel dielectric tunnel barrier layer 150. The reference layer 132 can have a thickness of 0.5 nm to 2 nm in this embodiment. The second texture-breaking nonmagnetic layer 176 can be formed on the reference layer 132, the SAF structure 120 can be formed on the second texture-breaking nonmagnetic layer 176, and the second electrode 184 can be formed on the SAF structure 120.

Figure 5:
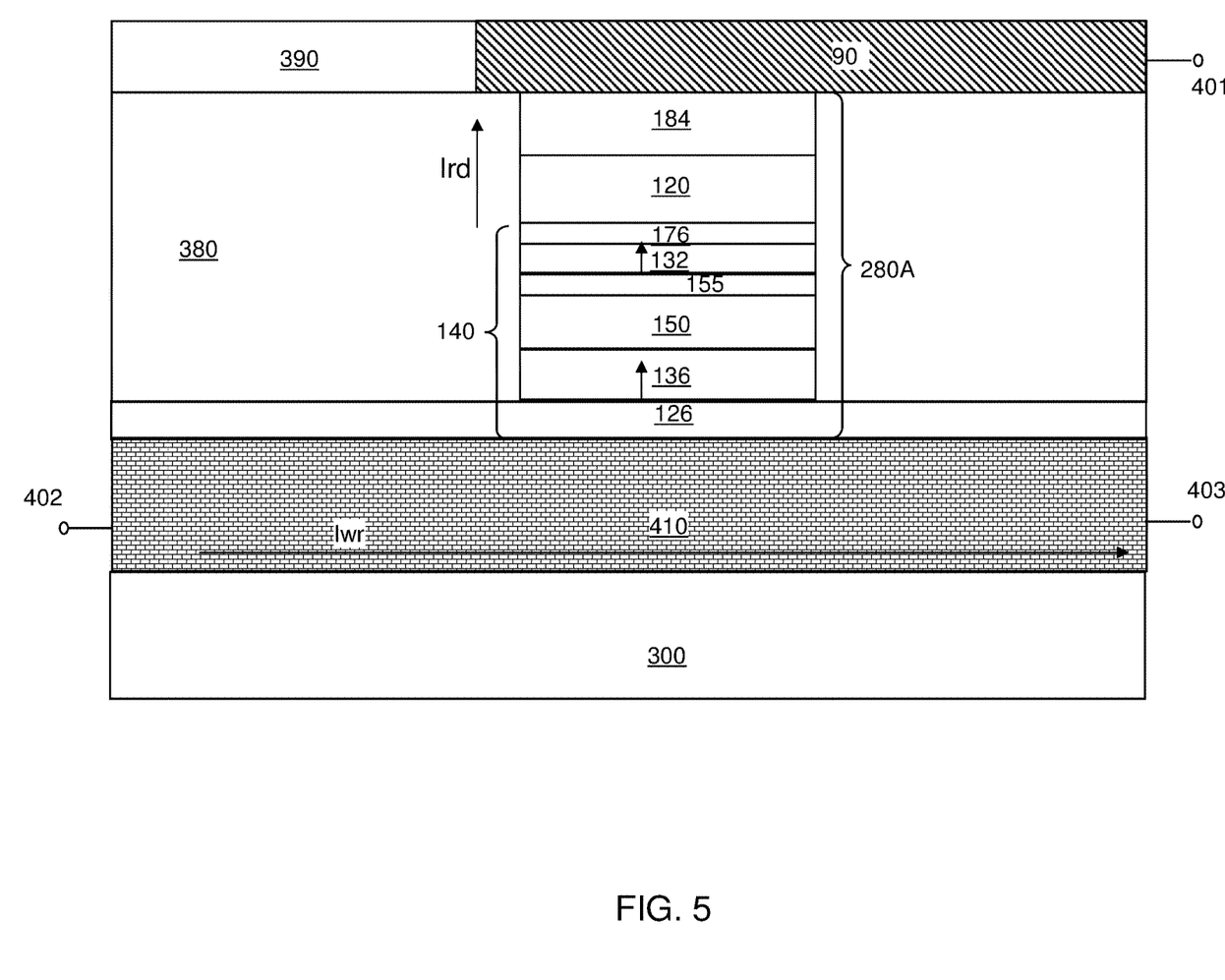

FIG. 5 is a schematic vertical cross-sectional view of a fourth exemplary magnetoresistive memory cell 280A of an alternative aspect of the third embodiment. The fourth exemplary magnetoresistive memory cell 280A can be derived from the third exemplary memory cell 280 of FIG. 4 by omitting the optional in plane magnetization ferromagnetic layer 266 and the nonmagnetic metal layer 412, and by forming the magnesium oxide dielectric layer 155 over the spinel dielectric tunnel barrier layer 150. In this cell 280A, the free layer 126 may be located on the first texture-breaking nonmagnetic layer 126.

In the third embodiment, the improved quality and lower defect density of the lattice matched interface between the ferromagnetic layers (132, 136) and the crystalline spinel dielectric tunnel barrier layer 150 can induce strong PMA. Without wishing to be bound by a particular theory, it is believed that the strong PMA may lead to a higher switching energy required to switch (i.e., flip) the magnetization direction of the free layer 136, which provides an improved SOT MRAM cell 280 or 280A thermal stability.

Referring to all drawings and according to all embodiments of the present disclosure, the magnetic tunnel junction of the embodiments of the present disclosure can provide large tunneling magnetoresistance ratio of about 300% or more at a high bias voltage in a range from 0.5 V to 1.0 V, and it is believed that it can provide enhanced endurance due to an improved interface quality and few defects relative to prior art magnetic tunnel junction devices employing a magnesium oxide dielectric tunneling barrier layer. The (001) texture in the magnesium oxide capping dielectric layer 155 induces (001) texture in each of the spinel dielectric barrier layer 150, the free layer 136, the reference layer 132, and the optional cap ferromagnetic layer 166.

According to various embodiments of the present disclosure, a magnetoresistive memory device (180, 180A, 280, 280A) includes a first electrode (110 or 410), a second electrode 284 that is spaced from the first electrode, and a perpendicular magnetic tunnel junction layer stack located between the first electrode and the second electrode. The perpendicular magnetic tunnel junction layer stack comprises a first texture-breaking nonmagnetic layer 126 comprising a first nonmagnetic transition metal, a second texture-breaking nonmagnetic layer 176 comprising a second nonmagnetic transition metal, a magnesium oxide capping dielectric layer 155 located between the first and second texture-breaking nonmagnetic layers, a reference layer 132 located between the first and second texture-breaking nonmagnetic layers, a free layer 136 located between the first and second texture-breaking nonmagnetic layers, and a spinel layer 150 located between the reference layer and the free layer, and including a polycrystalline spinel material having (001) texture along an axial direction extending between the reference layer and the free layer.

In one embodiment, at least 80% of an entire volume of the spinel layer 150 is occupied by spinel grains having the (001) texture. In other words, more than 80% (which may be greater than 90%, and/or greater than 95%, and/or greater than 98%) of the entire volume of the spinel layer 150 is occupied by spinel grains having (001) planes that are perpendicular to the axial direction. In one embodiment, the reference layer 132 and the free layer 136 have (001) texture. In other words, more than 50% (which may be greater than 80%, and/or greater than 90%, and/or greater than 95%, and/or greater than 98%) of the entire volume of the reference layer 132 is occupied by grins of a ferromagnetic material layer having (001) planes that are perpendicular to the axial direction, and more than 50% (which may be greater than 80%, and/or greater than 90%, and/or greater than 95%, and/or greater than 98%) of the entire volume of the free layer 136 is occupied by grins of a ferromagnetic material layer having (001) planes that are perpendicular to the axial direction.

In one embodiment, grains of the free layer 136 can be epitaxially aligned to grains of the spinel layer 150 across an interface between the free layer 136 and the spinel layer 150. In one embodiment, the magnesium oxide capping dielectric layer 155 includes grains having (001) texture, and the grains of the free layer 136 are epitaxially aligned to the grains of the magnesium oxide capping dielectric layer 155 across an interface between the magnesium oxide capping dielectric layer 155 and the free layer 136. In one embodiment, grains of the reference layer 132 are aligned to grains of the spinel layer 150 across an interface between the reference layer 132 and the spinel layer 150.

In one embodiment, the magnetoresistive memory device can comprise a cap ferromagnetic layer 166 comprising a polycrystalline ferromagnetic material having (001) texture. The magnesium oxide capping dielectric layer 155 is located between the free layer 136 and the cap ferromagnetic layer 166, and includes grains having (001) texture; and grains of the cap ferromagnetic layer 166 are epitaxially aligned to the grains of the magnesium oxide capping dielectric layer 155 across an interface between the magnesium oxide capping dielectric layer 155 and the cap ferromagnetic layer 166.

In one embodiment, the spinel layer 150 has a formula $M_xQ_yO_z$, in which $0.95<x<1.05$, $1.95<y<2.05$ and $3.95<z<4.05$ and M and Q are different metals, such as $Mg_xAl_yO_z$, in which $0.95<x<1.05$, $1.95<y<2.05$ and $3.95<z<4.05$. In one embodiment, the spinel layer 150 comprises a material selected from $MgAl_2O_4$, $ZnAl_2O_4$, $SiMg_2O_4$, $SiZn_2O_4$, $MgGa_2O_4$, doped derivatives therefrom in which a fraction of at least one metallic element is replaced with another metallic element while preserving the crystalline structure, and oxygen-deficient derivatives thereof.

In one embodiment, the magnetoresistive memory device comprises a synthetic antiferromagnet (SAF) structure 120 located between the one of the electrodes (184, 110 or 410) and the reference layer 132.

In one embodiment, each of the free layer 136 and the reference layer 132 has a respective easy axis of magnetization that is parallel to the axial direction. Thus, the perpendicular magnetic tunnel junction structure can have perpendicular magnetic anisotropy.

In one embodiment, each of the free layer 136 and the reference layer 132 comprises a CoFe alloy or a CoFeB alloy, the magnesium oxide capping dielectric layer 155 consists essentially of magnesium oxide, and the first texture-breaking nonmagnetic layer 126 and the second texture-breaking nonmagnetic layer 176 consist essentially of tungsten.

In one embodiment, the spinel layer 150 has a thickness in a range from 0.8 nm to 3 nm, the magnesium oxide capping dielectric layer 155 has a thickness in a range from 0.02 nm to 2 nm, the free layer 136 has a thickness in a range from 0.5 nm to 2 nm, and the reference layer 132 has a thickness in a range from 0.8 nm to 1.2 nm.

In the first embodiment shown in FIG. 2, the spinel layer 150 is a dielectric tunnel barrier layer which has a thickness in a range from 0.5 nm to 1.2 nm, and the magnetoresistive memory device 180 comprises a spin transfer torque magnetoresistive memory device. In the second embodiment shown in FIG. 3, the spinel layer has a thickness in a range from 1.5 nm to 3 nm, and the magnetoresistive memory device 180A comprises a voltage controlled magnetic anisotropy magnetoresistive memory device.

In one embodiment, the magnetic tunnel junction layer stack comprises a magnetic tunnel junction that provides tunneling magnetoresistance ratio in a range from 200% to 300% in a voltage range from 0.5 V to 1.0 V. A random access memory array including a two-dimensional array of instances of the magnetoresistive memory device is also provided.

In the third embodiment shown in FIGS. 4 and 5, the magnetoresistive memory device (280 or 280A) also includes a nonmagnetic heavy metal SOT layer 410, and the magnetoresistive memory device (280 or 280A) comprises a three terminal spin orbit torque magnetoresistive memory device. The spin orbit torque (SOT) magnetoresistive memory device (280 or 280A) comprises an electrode 184, a nonmagnetic heavy metal SOT layer 410 that is spaced from the electrode 184, and a perpendicular magnetic tunnel junction 140 layer stack located between the electrode and the SOT layer. The perpendicular magnetic tunnel junction 140 layer stack comprises a first texture-breaking nonmagnetic layer 126 comprising a first nonmagnetic transition metal, a second texture-breaking nonmagnetic layer 176 comprising a second nonmagnetic transition metal, a magnesium oxide dielectric layer 155 located between the first and second texture-breaking nonmagnetic layers, a reference layer 132 located between the first and second texture-breaking nonmagnetic layers, a free layer 136 located between the first and second texture-breaking nonmagnetic layers, and a spinel layer 150 located between the reference layer and the free layer, and including a polycrystalline spinel material having (001) texture along an axial direction extending between the reference layer and the free layer.

In the spin orbit torque (SOT) magnetoresistive memory device 280 of FIG. 4, the first texture-breaking nonmagnetic layer 126 is located over the SOT layer 410, an in plane magnetization ferromagnetic layer 266 is located over the first texture-breaking nonmagnetic layer 126, the magnesium oxide dielectric layer 155 is located over the first texture-breaking nonmagnetic layer 126. The magnesium oxide dielectric layer 155 can be formed above or below the in plane magnetization ferromagnetic layer 266. A nonmagnetic metal layer 412 is located over the in plane magnetization ferromagnetic layer 266 and the magnesium oxide dielectric layer 155, the free layer 136 is located over the nonmagnetic metal layer 412, the spinel layer 150 is located over the free layer 136, the reference layer 132 is located over the spinel layer 150, the second texture-breaking nonmagnetic layer 176 is located over the reference layer 132, and the electrode 184 is located over the second texture-breaking nonmagnetic layer 176.

In the spin orbit torque (SOT) magnetoresistive memory device 280A of FIG. 5, the first texture-breaking nonmagnetic layer 126 is located over the SOT layer 410, the free layer 136 is located over the first texture-breaking nonmagnetic layer 126, the spinel layer 150 is located over the free layer 136, the magnesium oxide dielectric layer 155 is located over (and may be located directly on) the spinel layer 150, the reference layer 132 is located over the magnesium oxide dielectric layer 155, the second texture-breaking nonmagnetic layer 176 is located over the reference layer 132 and the electrode 184 is located over the second texture-breaking nonmagnetic layer 176.

In the third embodiment, the magnesium oxide dielectric layer 155 has a thickness in a range from 0.5 nm to 1 nm, the free layer 136 comprises a CoFeB or CoFe layer having a thickness in a range from 0.2 nm to 0.8 nm, and the reference layer 132 comprises a CoFeB or CoFe layer having a thickness in a range from 0.5 nm to 2 nm.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A spin orbit torque (SOT) magnetoresistive memory device, comprising:
    an electrode;
    a nonmagnetic heavy metal SOT layer that is spaced from the electrode; and
    a perpendicular magnetic tunnel junction layer stack located between the electrode and the SOT layer, the perpendicular magnetic tunnel junction layer stack comprising:
        a first texture-breaking nonmagnetic layer comprising a first nonmagnetic transition metal;
        a second texture-breaking nonmagnetic layer comprising a second nonmagnetic transition metal;
        a magnesium oxide dielectric layer located between the first and second texture-breaking nonmagnetic layers;
        a reference layer located between the first and second texture-breaking nonmagnetic layers;
        a free layer located between the first and second texture-breaking nonmagnetic layers; and
        a spinel layer located between the reference layer and the free layer, and including a polycrystalline spinel material having (001) texture along an axial direction extending between the reference layer and the free layer.

2. The SOT magnetoresistive memory device of claim 1, wherein the reference layer and the free layer have (001) texture.

3. The SOT magnetoresistive memory device of claim 2, wherein grains of the free layer are epitaxially aligned to grains of the spinel layer across an interface between the free layer and the spinel layer.

4. The SOT magnetoresistive memory device of claim 3, wherein:
    the magnesium oxide dielectric layer includes grains having (001) texture;
    the grains of the free layer are epitaxially aligned to the grains of the magnesium oxide dielectric layer across an interface between the magnesium oxide dielectric layer and the free layer; and
    grains of the reference layer are aligned to grains of the spinel layer across an interface between the reference layer and the spinel layer.

5. The SOT magnetoresistive memory device of claim 1, wherein:
    the first texture-breaking nonmagnetic layer is located over the SOT layer;
    an in plane magnetization ferromagnetic layer is located over the first texture-breaking nonmagnetic layer;
    the magnesium oxide dielectric layer is located over the first texture-breaking nonmagnetic layer;
    a nonmagnetic metal layer is located over the in plane magnetization ferromagnetic layer and the magnesium oxide dielectric layer;
    the free layer is located over the nonmagnetic metal layer;
    the spinel layer is located over the free layer;
    the reference layer is located over the spinel layer;
    the second texture-breaking nonmagnetic layer is located over the reference layer; and
    the electrode is located over the second texture-breaking nonmagnetic layer.

6. The SOT magnetoresistive memory device of claim 1, wherein:
    the first texture-breaking nonmagnetic layer is located over the SOT layer;
    the free layer is located over the first texture-breaking nonmagnetic layer;
    the spinel layer is located over the free layer;
    the magnesium oxide dielectric layer is located over the spinel layer;
    the reference layer is located over the magnesium oxide dielectric layer;
    the second texture-breaking nonmagnetic layer is located over the reference layer; and
    the electrode is located over the second texture-breaking nonmagnetic layer.

7. The SOT magnetoresistive memory device of claim 1, wherein:
    the first nonmagnetic transition metal and the second nonmagnetic transition metal are independently selected from tungsten, ruthenium, tantalum, niobium, molybdenum, and rhenium; and
    each of the first texture-breaking nonmagnetic layer and the second texture-breaking nonmagnetic layer has a thickness in a range from 0.2 nm to 1 nm.

8. The SOT magnetoresistive memory device of claim 1, wherein the spinel layer has a formula $M_xQ_yO_z$, in which $0.95<x<1.05$, $1.95<y<2.05$ and $3.95<z<4.05$ and M and Q are different metals.

9. The SOT magnetoresistive memory device of claim 8, wherein the spinel layer comprises a material selected from $MgAl_2O_4$, $ZnAl_2O_4$, $SiMg_2O_4$, $SiZn_2O_4$, $MgGa_2O_4$, doped derivatives therefrom in which a fraction of at least one metallic element is replaced with another metallic element while preserving the crystalline structure, and oxygen-deficient derivatives thereof.

10. The SOT magnetoresistive memory device of claim 8, wherein the spinel layer has a formula $Mg_xAl_yO_z$, in which $0.95<x<1.05$, $1.95<y<2.05$ and $3.95<z<4.05$.

11. The SOT magnetoresistive memory device of claim 10, wherein the spinel layer comprises $MgAl_2O_4$.

12. The SOT magnetoresistive memory device of claim 1, further comprising a synthetic antiferromagnet (SAF) structure located between the electrode and the reference layer, wherein the first texture-breaking nonmagnetic layer is located between the SAF structure and the reference layer.

13. The SOT magnetoresistive memory device of claim 1, wherein the SOT layer is electrically connected to two terminals of the SOT magnetoresistive memory device.

14. The SOT magnetoresistive memory device of claim 1, wherein:
    the SOT layer has a thickness in a range from 5 nm to 10 nm; and
    the SOT layer comprises Pt, Ta, W, Hf, Ir, CuBi, CuIr, AuPt, AuW, PtPd, or PtMgO.

15. The SOT magnetoresistive memory device of claim 1, wherein:
    the magnesium oxide dielectric layer has a thickness in a range from 0.5 nm to 1 nm;
    the free layer comprises a CoFeB or CoFe layer having a thickness in a range from 0.2 nm to 0.8 nm; and
    the reference layer comprises a CoFeB or CoFe layer having a thickness in a range from 0.5 nm to 2 nm.

16. A method of forming a spin orbit torque (SOT) magnetoresistive memory device, comprising:
    forming a nonmagnetic heavy metal SOT layer over a substrate;
    depositing a magnetic tunnel junction layer stack over the SOT layer, wherein the magnetic tunnel junction layer stack comprises a first texture-breaking nonmagnetic layer including a first nonmagnetic transition metal, a reference layer including a first amorphous ferromagnetic material, a spinel layer including an amorphous spinel material, a free layer including a second amorphous ferromagnetic material, a magnesium oxide dielectric layer including grains having (001) texture, and a second texture-breaking nonmagnetic layer including a second nonmagnetic transition metal;

performing an anneal process to induce solid phase epitaxy crystallization of materials of the free layer, the spinel layer, and the reference layer using magnesium oxide dielectric layer as a crystallization template layer, to convert the amorphous spinel material into polycrystalline spinel material having (001) texture along an axial direction that is perpendicular to an interface between the spinel layer and the free layer; and forming an electrode over a portion of the magnetic tunnel junction layer stack prior to or after the anneal process.

17. The method of claim 16, wherein:

the solid phase epitaxy converts each of the reference layer and the free layer into polycrystalline ferromagnetic material layers having (001) texture;

grains in the free layer are epitaxially aligned to grains within the magnesium oxide dielectric layer during the solid phase epitaxy;

grains in the spinel layer are epitaxially aligned to the grains in the free layer during the solid phase epitaxy; and grains in the reference layer are epitaxially aligned to the grains in the spinel layer in the solid phase epitaxy.

18. The method of claim 16, wherein the spinel layer has a formula $Mg_xAl_yO_z$, in which $0.95<x<1.05$, $1.95<y<2.05$ and $3.95<z<4.05$.

19. The method of claim 16, wherein each of the first texture-breaking nonmagnetic layer and the second texture-breaking nonmagnetic layer blocks propagation of crystalline alignment of materials thereacross during the solid phase epitaxy crystallization.

20. The method of claim 16, wherein the magnetic tunnel junction layer stack further comprises an in plane ferromagnetic layer between the first texture-breaking nonmagnetic layer and the magnesium oxide dielectric layer.

* * * * *